United States Patent
Lv et al.

(10) Patent No.: US 11,438,020 B2
(45) Date of Patent: Sep. 6, 2022

(54) SIGNAL PROCESSING APPARATUS AND METHOD, AND ACCESS NETWORK DEVICE

(71) Applicant: HUAWEI TECHNOLOGIES CO., LTD., Guangdong (CN)

(72) Inventors: Jia Lv, Shanghai (CN); Haizheng Tang, Shanghai (CN); Ling Guo, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/360,287

(22) Filed: Jun. 28, 2021

(65) Prior Publication Data

US 2021/0328612 A1    Oct. 21, 2021

Related U.S. Application Data

(63) Continuation of application No. PCT/CN2018/124913, filed on Dec. 28, 2018.

(51) Int. Cl.
*H04B 1/10*    (2006.01)
*H04B 1/00*    (2006.01)
(Continued)

(52) U.S. Cl.
CPC ......... *H04B 1/1081* (2013.01); *H04B 1/0067* (2013.01); *H04B 7/0837* (2013.01);
(Continued)

(58) Field of Classification Search
CPC .................................................. H04B 1/1081
See application file for complete search history.

(56) References Cited

U.S. PATENT DOCUMENTS 5,729,829 A * 3/1998 Talwar ............... H04B 7/005
455/296
2001/0024949 A1    9/2001 Yanagida et al.
(Continued)

FOREIGN PATENT DOCUMENTS

CN    101534141 A    9/2009
CN    102347779 A    2/2012
(Continued)

OTHER PUBLICATIONS

Extended European Search Report issued in European Application No. 18944234.6 dated Nov. 3, 2021, 6 pages.
(Continued)

*Primary Examiner* — Hsinchun Liao
(74) *Attorney, Agent, or Firm* — Fish & Richardson P.C.

(57) ABSTRACT

Example signal processing methods and apparatus are described. The signal processing apparatus includes a first power amplifier, a second power amplifier, a first filter, a second filter, and a combiner. The first filter filters a second signal obtained by the first power amplifier to obtain a first sub-signal belonging to a first frequency band and a second sub-signal belonging to a second frequency band. The second filter filters a fourth signal obtained by the second power amplifier to obtain n sub-signals including at least a third sub-signal belonging to a third frequency band. The combiner combines the first sub-signal and i sub-signals in the n sub-signals based on a preset condition to obtain a first combined signal. The communication module sends the first combined signal by using a first port, and sends the second sub-signal by using a second port.

16 Claims, 6 Drawing Sheets

(51) Int. Cl.
*H04B 7/08* (2006.01)
*H04B 7/12* (2006.01)
*H03F 3/20* (2006.01)

(52) U.S. Cl.
CPC .................. *H04B 7/12* (2013.01); *H03F 3/20* (2013.01); *H03F 2200/171* (2013.01)

(56) References Cited

U.S. PATENT DOCUMENTS

| | | |
|---|---|---|
| 2004/0229576 A1 | 11/2004 | Amano |
| 2004/0248614 A1 | 12/2004 | Ella |
| 2005/0048932 A1 | 3/2005 | Balasubramaniyan et al. |
| 2006/0063543 A1 | 3/2006 | Matoba et al. |
| 2007/0013458 A1 | 1/2007 | Itou et al. |
| 2007/0259628 A1 | 11/2007 | Carmel et al. |
| 2008/0174470 A1* | 7/2008 | Lum .................... H04B 7/0845 342/16 |
| 2008/0246561 A1 | 10/2008 | Blair et al. |
| 2010/0127795 A1 | 5/2010 | Bauer et al. |
| 2010/0248660 A1 | 9/2010 | Bavisi et al. |
| 2010/0278411 A1 | 11/2010 | Krauss et al. |
| 2010/0291888 A1 | 11/2010 | Hadjichristos et al. |
| 2014/0044155 A1 | 2/2014 | Honcharenko |
| 2014/0335804 A1 | 11/2014 | Lee et al. |
| 2015/0362574 A1 | 12/2015 | Wu et al. |
| 2016/0006407 A1 | 1/2016 | Brooks et al. |
| 2016/0072168 A1 | 3/2016 | Kawaguchi et al. |
| 2016/0277049 A1 | 9/2016 | Kang et al. |
| 2016/0322996 A1 | 11/2016 | Jabbour et al. |
| 2016/0381648 A1* | 12/2016 | Tanaka .................. H04W 52/52 370/280 |
| 2017/0012763 A1 | 1/2017 | Wu et al. |
| 2017/0338839 A1 | 11/2017 | Little |
| 2018/0034486 A1 | 2/2018 | Pham et al. |
| 2018/0138995 A1 | 5/2018 | Kang et al. |
| 2018/0337643 A1 | 11/2018 | Yoshimi |
| 2019/0103927 A1* | 4/2019 | Kapur .................. H04B 10/697 |

FOREIGN PATENT DOCUMENTS

| | | |
|---|---|---|
| CN | 107800459 A | 3/2018 |
| CN | 107800460 A | 3/2018 |
| JP | 2018196104 A | 12/2018 |
| KR | 20160106996 A | 9/2016 |
| RU | 2658656 C2 | 6/2018 |
| WO | 2007008313 A1 | 1/2007 |
| WO | 2009009959 A1 | 1/2009 |
| WO | 2016004589 A1 | 1/2016 |
| WO | 2016187887 A1 | 12/2016 |
| WO | 2017071331 A1 | 5/2017 |

OTHER PUBLICATIONS

Office Action issued in Chinese Application No. 201880100488.1 dated Dec. 14, 2021, 7 pages (with English translation).

Yan et al., "Design and Implementation of the Digital Controlled Power Amplifier," Electronic Engineer, vol. 34, No. 2, Feb. 2008, 5 pages (with English abstract).

PCT International Search Report and Written Opinion issued in International Application No. PCT/CN2018/124913 dated Sep. 10, 2019, 16 pages (with English translation).

Office Action issued in Russian Application No. 2021121981/ 07(046003) dated Mar. 25, 2022, 22 pages (with English translation).

* cited by examiner

SIGNAL PROCESSING APPARATUS AND METHOD, AND ACCESS NETWORK DEVICE

CROSS-REFERENCE TO RELATED APPLICATIONS

This application is a continuation of International Application No. PCT/CN2018/124913, filed on Dec. 28, 2018, the disclosure of which is hereby incorporated by reference in its entirety.

TECHNICAL FIELD

Embodiments of this application relate to the field of communication technologies, and in particular, to a signal processing apparatus and method, and an access network device.

BACKGROUND

With development of communication technologies, a radio remote unit (radio remote unit, RRU) supporting a plurality of frequency bands is increasingly widely used. The RRU supporting a plurality of frequency bands means that the RRU supports transmission of signals belonging to the plurality of frequency bands through one or more antenna ports. However, currently, there is no RRU that can not only avoid a passive intermodulation (passive intermodulation, PIM) problem but also appropriately reduce a quantity of antenna ports used.

SUMMARY

Embodiments of this application provide a signal processing apparatus and method, and an access network device, to not only effectively avoid a PIM problem but also reduce a quantity of antenna ports used.

To achieve the foregoing objective, the following technical solutions are used in the embodiments of this application.

According to a first aspect, a signal processing apparatus is provided. The signal processing apparatus includes a power amplification module, a processing module connected to the power amplification module, and a communication module connected to the processing module. The power amplification module includes a first power amplifier and a second power amplifier. The processing module includes a first filter unit connected to the first power amplifier, a second filter unit connected to the second power amplifier, and a combiner unit connected to the first filter unit, the second filter unit, and the communication module.

Specifically, the first power amplifier is configured to: perform power amplification on a received first signal, to obtain a second signal, and send the second signal to the first filter unit, where the first signal includes a signal belonging to a first frequency band and a signal belonging to a second frequency band. The first filter unit is configured to: receive the second signal sent by the first power amplifier, and filter the second signal, to obtain a first sub-signal belonging to the first frequency band and a second sub-signal belonging to the second frequency band. The second power amplifier is configured to: perform power amplification on a received third signal, to obtain a fourth signal, and send the fourth signal to the second filter unit, where the third signal includes at least a signal belonging to a third frequency band. The second filter unit is configured to: receive the fourth signal sent by the second power amplifier, and filter the fourth signal, to obtain n (n is an integer greater than or equal to 1) sub-signals, where the n sub-signals include at least a third sub-signal belonging to the third frequency band. The combiner unit is configured to: combine the first sub-signal and i ($1 \leq i \leq n$, and i is an integer) sub-signals in the n sub-signals based on a preset condition, to obtain a first combined signal, and send the first combined signal and the second sub-signal to the communication module. The communication module is configured to: send the first combined signal by using a first port, and send the second sub-signal by using a second port.

It can be learned that the signal processing apparatus in this application can separate signals belonging to a plurality of frequency bands, combine, based on the preset condition, signals belonging to different frequency bands, and send a combined signal by using a port of the communication module, thereby effectively reducing a quantity of ports used. If the preset condition is to combine signals whose frequency band difference is greater than or equal to a preset threshold, the combined signal does not encounter the PIM problem after the signal processing apparatus combines the signals belonging to different frequency bands, thereby effectively avoiding the PIM problem. In conclusion, the signal processing apparatus in this application can not only effectively avoid the PIM problem but also reduce a quantity of ports used.

In addition, if the preset condition is to combine a signal belonging to a first preset frequency band and a signal belonging to a second preset frequency band, the signal processing apparatus can effectively meet a communication requirement in a timely manner. In the signal processing apparatus in this application, frequency band combinations supported by the power amplifiers do not correspond, in a one-to-one manner, to frequency band combinations to which signals sent by the ports belong, and the two are totally decoupled, thereby effectively reducing difficulty in developing the power amplifiers.

Optionally, in a possible implementation of this application, if n is an integer greater than or equal to 2, any two sub-signals in the n sub-signals belong to different frequency bands.

If n is equal to 1, the second power amplifier is a single-band power amplifier. If n is an integer greater than or equal to 2, the second power amplifier is a multi-band power amplifier. In a scenario in which the second power amplifier is a multi-band power amplifier, the second filter unit obtains a plurality of sub-signals, and any two sub-signals obtained by the second filter unit belong to different frequency bands.

Optionally, in another possible implementation of this application, if n is an integer greater than or equal to 2, and $1 \leq i < n$, the combiner unit is further configured to combine the second sub-signal and (n−i) sub-signals other than the i sub-signals in the n sub-signals based on the preset condition, to obtain a second combined signal. Correspondingly, that the combiner unit is configured to send the second sub-signal to the communication module specifically includes: The combiner unit is specifically configured to send the second combined signal to the communication module.

In a scenario in which the second power amplifier is a multi-band power amplifier, for the (n−i) sub-signals other than the i sub-signals in the n sub-signals, processing manners of the combiner unit are as follows: Manner 1: sending the (n−i) sub-signals to the communication module, so that the communication module sends the (n−i) sub-signals by using (n−i) ports, where each of the (n−i) ports sends one of the (n−i) sub-signals, and any two different ports in the (n−i) ports send different sub-signals; and Manner 2: combining the second sub-signal and the (n−i) sub-signals, to obtain the second combined signal, and sending the second combined signal to the communication module.

The processing manners of the combiner unit implement free combination of signals belonging to different frequency bands.

Optionally, in another possible implementation of this application, if the combiner unit is further configured to obtain the second combined signal, that "the communication module is configured to send the second sub-signal by using a second port" specifically includes: The communication module is specifically configured to send the second combined signal by using the second port.

The communication module sends the second combined signal by using the second port, thereby effectively reducing a quantity of ports used in the signal processing apparatus.

Optionally, in another possible implementation of this application, the preset condition is to combine signals whose frequency band difference is greater than or equal to a preset threshold, or to combine a signal belonging to a first preset frequency band and a signal belonging to a second preset frequency band.

According to a second aspect, an access network device is provided. The access network device includes the signal processing apparatus according to any one of the first aspect or the possible implementations of the first aspect.

According to a third aspect, a signal processing method is provided. The signal processing method is applied to the signal processing apparatus according to any one of the first aspect or the possible implementations of the first aspect. Specifically, after receiving a first signal that includes a signal belonging to a first frequency band and a signal belonging to a second frequency band, and a third signal that includes at least a signal belonging to a third frequency band, the signal processing apparatus performs power amplification on the first signal, to obtain a second signal, and performs power amplification on the third signal, to obtain a fourth signal; then the signal processing apparatus filters the second signal, to obtain a first sub-signal and a second sub-signal, and filters the fourth signal, to obtain n (n is an integer greater than or equal to 1) sub-signals, where the n sub-signals include at least a third sub-signal belonging to the third frequency band; and subsequently, the signal processing apparatus combines the first sub-signal and i (1≤i≤n, and i is an integer) sub-signals in the n sub-signals based on a preset condition, to obtain a first combined signal, sends the first combined signal by using a first port, and sends the second sub-signal by using a second port.

Optionally, in a possible implementation of this application, if n is an integer greater than or equal to 2, any two sub-signals in the n sub-signals belong to different frequency bands.

Optionally, in another possible implementation of this application, if 1≤i<n, the signal processing apparatus further combines the second sub-signal and (n−i) sub-signals other than the i sub-signals in the n sub-signals based on the preset condition, to obtain a second combined signal.

Optionally, in another possible implementation of this application, the method that "the signal processing apparatus sends the second sub-signal by using a second port" is: The signal processing apparatus sends the second combined signal by using the second port.

Optionally, in another possible implementation of this application, the preset condition in this application is to combine signals whose frequency band difference is greater than or equal to a preset threshold, or to combine a signal belonging to a first preset frequency band and a signal belonging to a second preset frequency band.

In this application, a name of the signal processing apparatus does not constitute a limitation on devices or functional modules. In actual implementation, these devices or functional modules may appear under other names. Each device or functional module falls within the scope of the claims and their equivalent technologies in this application, provided that a function of each device or functional module is similar to a function of a device or a functional module in this application.

For specific descriptions of the second aspect and the third aspect in this application, refer to detailed descriptions in the first aspect and various implementations of the first aspect. In addition, for beneficial effects of the second aspect and the third aspect, refer to beneficial effect analysis in the first aspect and various implementations of the first aspect. Details are not described herein again.

These aspects or other aspects of this application are more concise and understandable in the following description.

DESCRIPTION OF EMBODIMENTS

In the specification, claims, and accompanying drawings of this application, the terms "first", "second", "third", "fourth" and so on are intended to distinguish between different objects but do not indicate a particular order.

In the embodiments of this application, the word "example" or "for example" is used to represent giving an example, an illustration, or a description. Any embodiment or design scheme described as an "example" or "for example" in the embodiments of this application should not be explained as being more preferred or having more advantages than another embodiment or design scheme. Exactly, use of the word "example", "for example", or the like is intended to present a relative concept in a specific manner.

The embodiments of this application provide a signal processing apparatus and method, and an access network device, to not only effectively avoid a PIM problem but also reduce a quantity of antenna ports used.

The signal processing apparatus provided in the embodiments of this application may be applied to various communication system, for example, a global system of mobile communications (global system of mobile communication, GSM) system, a code division multiple access (code division multiple access, CDMA) system, a wideband code division multiple access wireless (wideband code division multiple access, WCDMA) system, a general packet radio service (general packet radio service, GPRS) system, a long term evolution (long term evolution, LTE) system, an advanced long term evolution (advanced long term evolution, LTE-A), a universal mobile telecommunication system (universal mobile telecommunication system. UMTS), an evolved long term evolution (evolved long term evolution, eLTE) system, 5G (for example, a new radio (new radio, NR) system), and other mobile communication systems.

The signal processing apparatus in the embodiments of this application may be an RRU, or may be a part of an apparatus in an access network device. This is not specifically limited in the embodiments of this application.

The following describes in detail the signal processing apparatus provided in the embodiments of this application with reference to the accompanying drawings.

Figure 1:
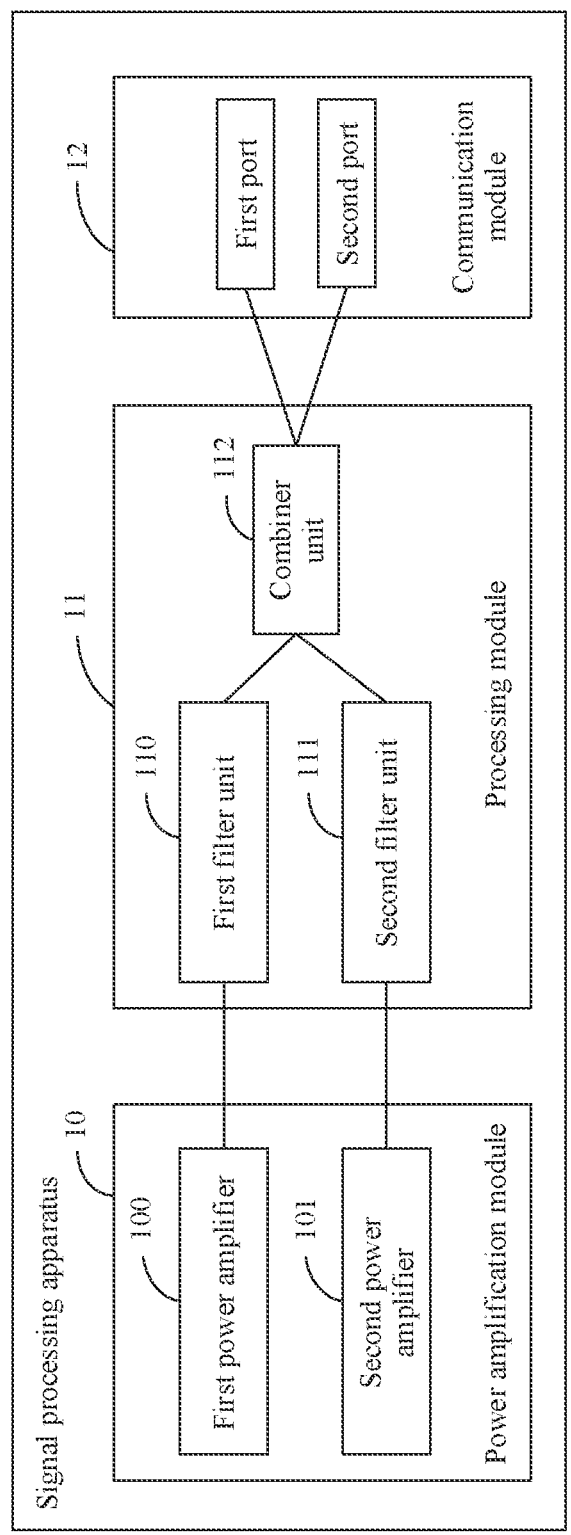
FIG. 1 is a schematic structural diagram 1 of a signal processing apparatus according to an embodiment of this application.

An embodiment of this application provides a signal processing apparatus. As shown in FIG. 1, the signal processing apparatus includes a power amplification module 10, a processing module 11 connected to the power amplification module 10, and a communication module 12 connected to the processing module 11. The power amplification module 10 includes a first power amplifier 100 and a second power amplifier 101. The processing module 11 includes a first filter unit 110 connected to the first power amplifier 100, a second filter unit 111 connected to the second power amplifier 101, and a combiner unit 112 connected to the first filter unit 110, the second filter unit 111, and the communication module 12. The communication module 12 includes a first port and a second port.

The first power amplifier 100 is a multi-band power amplifier, for example, a dual-band power amplifier. The first power amplifier 100 is configured to: perform power amplification on a received first signal, to obtain a second signal, and send the second signal to the first filter unit 110, where the first signal includes a signal belonging to a first frequency band and a signal belonging to a second frequency band.

The first filter unit 110 is configured to: receive the second signal sent by the first power amplifier 100, and filter the second signal, to obtain a first sub-signal belonging to the first frequency band and a second sub-signal belonging to the second frequency band.

The first filter unit 110 can remove a noise signal from the second signal, to ensure signal quality of the first sub-signal and the second sub-signal.

The second power amplifier 101 is configured to: perform power amplification on a received third signal, to obtain a fourth signal, and send the fourth signal to the second filter unit 111, where the third signal includes at least a signal belonging to a third frequency band.

A frequency band supported by the second power amplifier 101 is different from a frequency band supported by the first power amplifier 100.

The second power amplifier 101 may be a single-band power amplifier, or may be a multi-band power amplifier. If the second power amplifier 101 is a single-band power amplifier, the second power amplifier 101 can perform power amplification only on a signal belonging to a single frequency band. If the second power amplifier 101 is a multi-band power amplifier, the second power amplifier 101 can perform power amplification on signals belonging to a plurality of frequency bands.

The second filter unit 111 is configured to: receive the fourth signal sent by the second power amplifier 101, and filter the fourth signal, to obtain n (n is an integer greater than or equal to 1) sub-signals, where the n sub-signals include at least a third sub-signal belonging to the third frequency band.

The combiner unit 112 is configured to: combine the first sub-signal and i ($1 \leq i \leq n$, and i is an integer) sub-signals in the n sub-signals based on a preset condition, to obtain a first combined signal, and send the first combined signal and the second sub-signal to the communication module 12.

The communication module 12 is configured to: send the first combined signal by using the first port, and send the second sub-signal by using the second port.

In hardware implementation, the communication module 12 may be implemented by using an antenna, or may be implemented by using a common cable interface. If the communication module 12 is implemented by using an antenna, the communication module 12 may include one antenna, where the antenna includes at least two ports, or may include a plurality of antennas, where each antenna includes at least one port. This is not specifically limited in this embodiment of this application.

The first port and the second port in this embodiment of this application may be ports of a same antenna, or may be ports of different antennas. This is not specifically limited in this embodiment of this application.

If n is an integer greater than or equal to 2, any two sub-signals in the n sub-signals obtained by the second filter unit 111 belong to different frequency bands. In this case, the second power amplifier 101 is a multi-band power amplifier.

If n is an integer greater than or equal to 2, and i=n, the first combined signal includes the first sub-signal and all signals that the second filter unit 111 obtains after performing filtering.

If n is an integer greater than or equal to 2, and $1 \leq i < n$, for (n−i) sub-signals other than the i sub-signals in the n sub-signals, the combiner unit 112 is configured to send the (n−i) sub-signals to the communication module 12, so that the communication module sends the (n−i) sub-signals by using (n−i) ports, where each of the (n−i) ports sends one of the (n−i) sub-signals, and any two different ports in the (n−i) ports send different sub-signals; or the combiner unit 112 is configured to: combine the second sub-signal and the (n−i) sub-signals based on the preset condition, to obtain a second combined signal, and send the second combined signal to an antenna.

The combiner unit 112 may combine the first sub-signal and the i sub-signals in the n sub-signals based on the preset condition, or may combine the second sub-signal and the (n−i) sub-signals based on the preset condition, thereby implementing free combination of signals belonging to different frequency bands.

If the combiner unit 112 combines the second sub-signal and the (n−i) sub-signals into the second combined signal based on the preset condition, the combiner unit 112 is specifically configured to send the second combined signal to the communication module 12. Correspondingly, the communication module 12 is specifically configured to send the second combined signal by using the second port.

The preset condition in this application is to combine signals whose frequency band difference is greater than or equal to a preset threshold, or to combine a signal belonging to a first preset frequency band (for example, the first frequency band) and a signal belonging to a second preset frequency band (for example, the third frequency band).

If the preset condition is to combine signals whose frequency band difference is greater than or equal to a preset threshold, a combined signal does not encounter a PIM problem after the signal processing apparatus combines the signals whose frequency band difference is greater than or equal to the preset threshold, thereby effectively avoiding the PIM problem.

If the preset condition is to combine a signal belonging to a first preset frequency band and a signal belonging to a second preset frequency band, the signal processing apparatus can effectively meet a communication requirement in a timely manner after the signal processing apparatus combines a signal belonging to a first preset frequency band and a signal belonging to a second preset frequency band, to implement a user's management and control on both the signal belonging to the first preset frequency band and the signal belonging to the second preset frequency band.

In hardware implementation, the processing module 11 in this embodiment of this application may be implemented by using a filter, or certainly, may be implemented by using another device with a function of the processing module 11. This is not specifically limited in this embodiment of this application.

For example, the first power amplifier 100 is a dual-band power amplifier, and is configured to perform power amplification on a signal belonging to a frequency band A and a signal belonging to a frequency band B; and the second power amplifier 101 is a single-band power amplifier, and is configured to perform power amplification on a signal belonging to a frequency band C. Correspondingly, the first filter unit 110 filters a signal output by the first power amplifier 100, to obtain a first sub-signal A belonging to the frequency band A and a second sub-signal B belonging to the frequency band B; and the second filter unit 111 filters a signal output by the second power amplifier 101, to obtain a third sub-signal C belonging to the frequency band C. Subsequently, the combiner unit 112 combines the first sub-signal A (or the second sub-signal B) and the third sub-signal C. and sends a combined signal to the first port, so that the first port sends the combined signal. The combiner unit 112 also sends the second sub-signal B (or the first sub-signal A) to the second port, so that the second port sends the sub-signal.

It should be noted that a structure shown in FIG. 1 is merely an example of the signal processing apparatus 11. In actual application, the power amplification module 10 may alternatively include a larger quantity of power amplifiers, and likewise, the processing module 11 may alternatively include a larger quantity of filter units, and the communication module 12 may alternatively include a larger quantity of ports (for example, four ports or eight ports).

Figure 2:
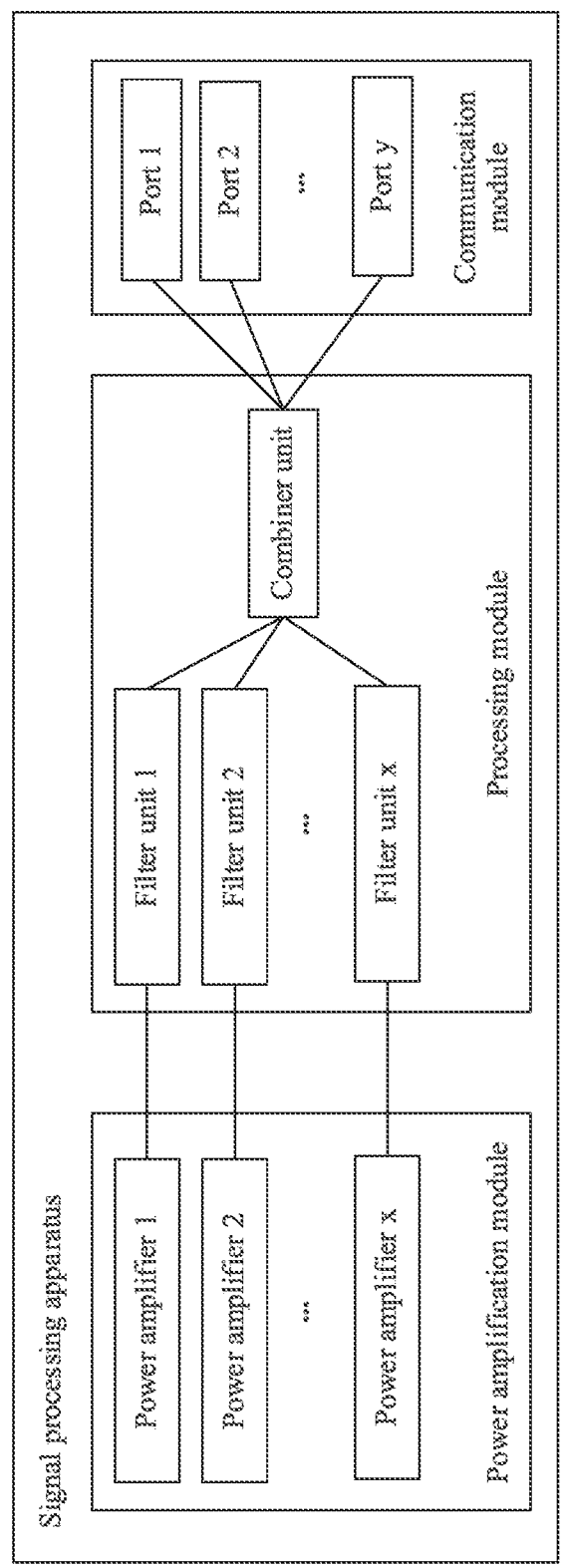
FIG. 2 is a schematic structural diagram 2 of a signal processing apparatus according to an embodiment of this application.

For example, FIG. 2 shows a structure of a signal processing apparatus according to an embodiment of this application. As shown in FIG. 2, the signal processing apparatus includes a power amplification module, a processing module, and y (y is an integer greater than or equal to 2) ports. The power amplification module includes x (x is an integer greater than 2) power amplifiers, and the processing module includes x filter units and a combiner unit connected to the x filter units.

For a clearer understanding of the signal processing apparatus provided in the embodiments of this application, the signal processing apparatus is described with reference to FIG. 1 by using an example in which the communication module 12 is an antenna including the first port and the second port, a first frequency band is the frequency band A, a second frequency band is the frequency band B, a third frequency band is the frequency band C, a fourth frequency band is a frequency band D, a first signal includes a signal belonging to the frequency band A and a signal belonging to the frequency band B, and one antenna includes two ports.

In a possible implementation, the first power amplifier 100 is a dual-band power amplifier, the second power amplifier 101 is a single-band power amplifier, and a third signal is a signal belonging to the frequency band C.

Figure 3:
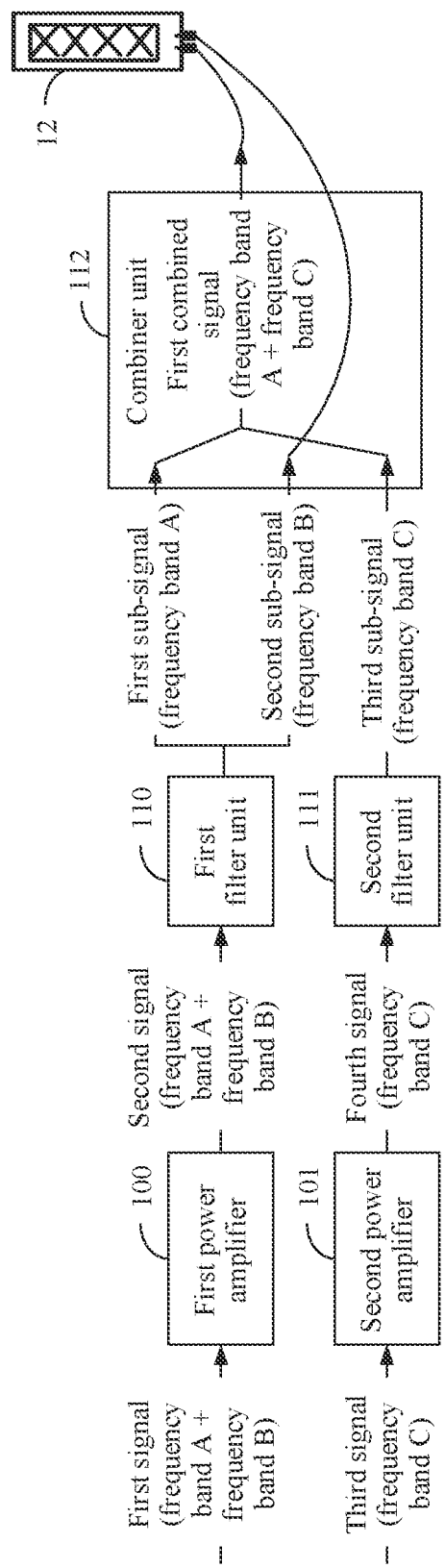
FIG. 3 is a schematic flowchart 1 of processing a signal by a signal processing apparatus according to an embodiment of this application.

Specifically, after receiving the first signal that includes the signal belonging to the frequency band A and the signal belonging to the frequency band B, the first power amplifier 100 performs power amplification on the first signal, to obtain a second signal, and sends the second signal to the first filter unit 110, where the second signal also includes the signal belonging to the frequency band A and the signal belonging to the frequency band B. After the first filter unit 110 filters the second signal, the first filter unit 110 obtains a first sub-signal and a second sub-signal, where the first sub-signal belongs to the frequency band A. and the second sub-signal belongs to the frequency band B. After receiving the third signal, the second power amplifier 101 performs power amplification on the third signal, to obtain a fourth signal, and sends the fourth signal to the second filter unit 111, where the fourth signal is also a signal belonging to the frequency band C. After the second filter unit 111 filters the fourth signal, the second filter unit 111 obtains a third sub-signal, where the third sub-signal belongs to the frequency band C. The combiner unit 112 combines the first sub-signal and the third sub-signal, to obtain a first combined signal (frequency bands corresponding to the first combined signal are the frequency band A and the frequency band C), and sends the first combined signal and the second sub-signal to the communication module 12. Then, the first port of the communication module 12 sends the first combined signal, and the second port of the communication module 12 sends the second sub-signal. FIG. 3 shows a signal processing process of the signal processing apparatus.

In another possible implementation, the first power amplifier 100 is a dual-band power amplifier, the second power amplifier 101 is a dual-band power amplifier, and a third signal includes a signal belonging to the frequency band C and a signal belonging to the frequency band D.

Specifically, after receiving the first signal that includes the signal belonging to the frequency band A and the signal belonging to the frequency band B, the first power amplifier 100 performs power amplification on the first signal, to obtain a second signal, and sends the second signal to the first filter unit 110, where the second signal also includes the signal belonging to the frequency band A and the signal belonging to the frequency band B. After the first filter unit 110 filters the second signal, the first filter unit 110 obtains a first sub-signal and a second sub-signal, where the first sub-signal belongs to the frequency band A, and the second sub-signal belongs to the frequency band B. After receiving the third signal that includes the signal belonging to the frequency band C and the signal belonging to the frequency band D, the second power amplifier 101 performs power amplification on the third signal, to obtain a fourth signal, and sends the fourth signal to the second filter unit 111, where the fourth signal also includes the signal belonging to the frequency band C and the signal belonging to the frequency band D. After the second filter unit 111 filters the fourth signal, the second filter unit 111 obtains a third sub-signal and a fourth sub-signal, where the third sub-signal belongs to the frequency band C, and the fourth sub-signal belongs to the frequency band D.

Figure 4:
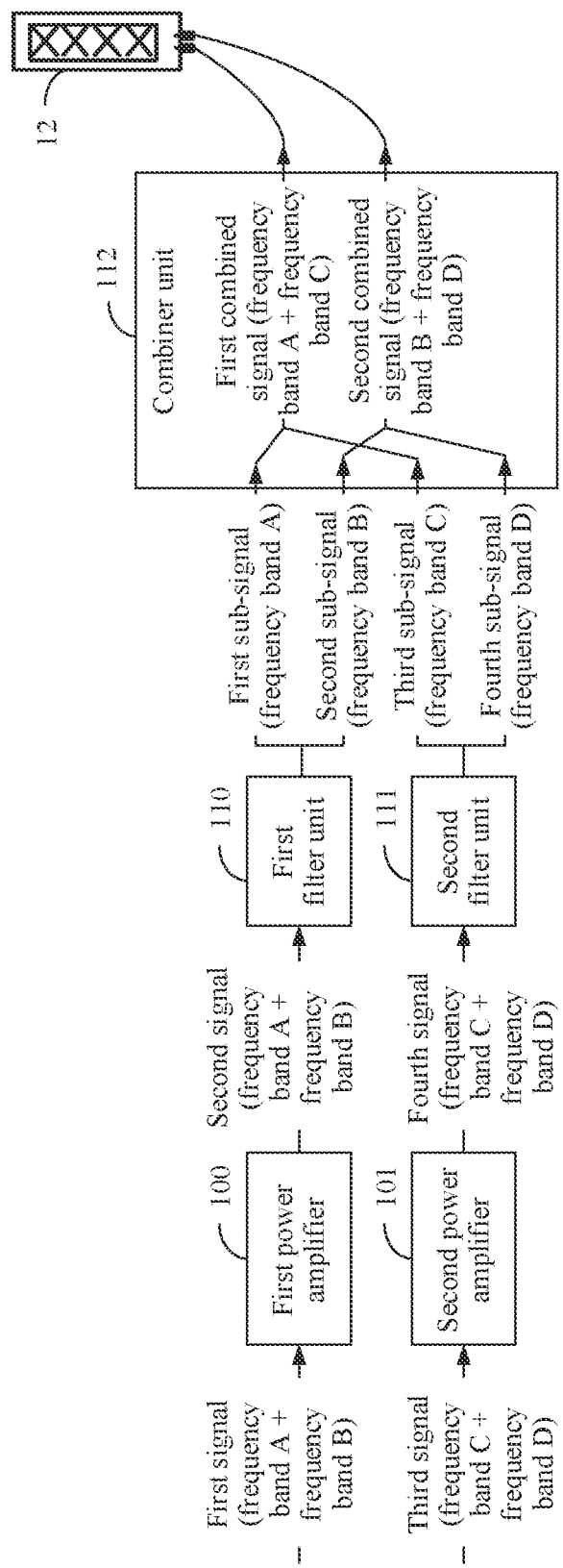
FIG. 4 is a schematic flowchart 2 of processing a signal by a signal processing apparatus according to an embodiment of this application.

If a preset condition is "to combine a signal belonging to a frequency band 1 and a signal belonging to a frequency band 3, and to combine a signal belonging to a frequency band 2 and a signal belonging to a frequency band 4", the combiner unit 112 combines the first sub-signal and the third sub-signal, to obtain a first combined signal (frequency bands corresponding to the first combined signal are the frequency band A and the frequency band C), combines the second sub-signal and the fourth sub-signal, to obtain a second combined signal (frequency bands corresponding to the second combined signal are the frequency band B and the frequency band D), and sends the first combined signal and the second combined signal to the communication module 12. Then, the first port of the communication module 12 sends the first combined signal, and the second port of the communication module 12 sends the second combined sub-signal FIG. 4 shows a signal processing process of the signal processing apparatus.

Figure 5:
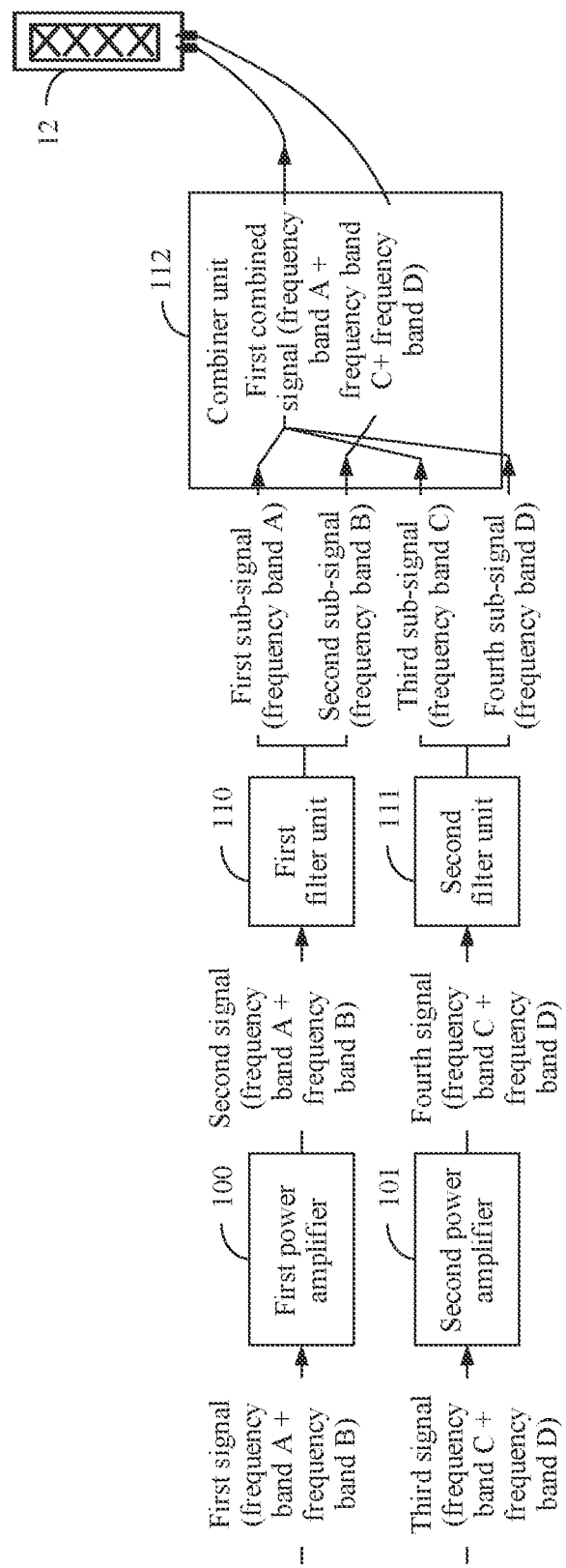
FIG. 5 is a schematic flowchart 3 of processing a signal by a signal processing apparatus according to an embodiment of this application.

If a preset condition is "to combine a signal belonging to a frequency band 1, a signal belonging to a frequency band 3, and a signal belonging to a frequency band 4", the combiner unit 112 combines the first sub-signal, the third sub-signal, and the fourth sub-signal, to obtain a first combined signal (frequency bands corresponding to the first combined signal are the frequency band A, the frequency band C, and the frequency band D), and sends the first combined signal and the second sub-signal to the communication module 12. Then, the first port of the communication module 12 sends the first combined signal, and the second port of the communication module 12 sends the second sub-signal. FIG. 5 shows a signal processing process of the signal processing apparatus.

In conclusion, the signal processing apparatus in the embodiments of this application can separate signals belonging to a plurality of frequency bands, combine, based on the preset condition, signals belonging to different frequency bands, and send a combined signal by using a port of the communication module, thereby effectively reducing a quantity of ports used.

If the preset condition is to combine signals whose frequency band difference is greater than or equal to a preset threshold, the combined signal does not encounter a PIM problem after the signal processing apparatus combines the signals belonging to different frequency bands, thereby effectively avoiding the PIM problem.

In other words, the signal processing apparatus in this application can not only effectively avoid the PIM problem but also reduce a quantity of ports used.

In addition, if the preset condition is to combine a signal belonging to a first preset frequency band and a signal belonging to a second preset frequency band, the signal processing apparatus can effectively meet a communication requirement in a timely manner. In the signal processing apparatus in this application, frequency band combinations supported by the power amplifiers do not correspond, in a one-to-one manner, to frequency band combinations to which signals sent by the ports belong, and the two are totally decoupled, thereby effectively reducing difficulty in developing the power amplifiers.

Figure 6:
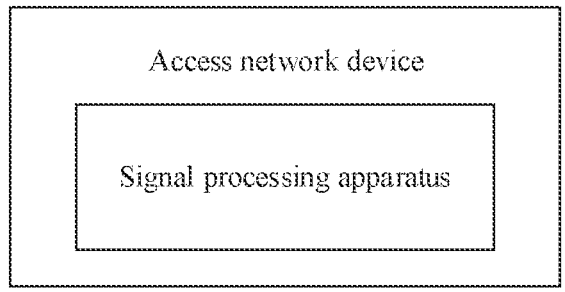
FIG. 6 is a schematic structural diagram of an access network device according to an embodiment of this application.

An embodiment of this application further provides an access network device. As shown in FIG. 6, the access network device includes the signal processing apparatus shown in FIG. 1 or FIG. 2. For a description of the signal processing apparatus, refer to the foregoing related description. Details are not described herein again.

The access network device in this embodiment of this application may be a common base station (for example, a Node B or an eNB), a new radio controller (new radio controller, NR controller), a gNode B/gNB in a 5G system, a new radio base station, a micro base station, a relay (relay), a distributed unit (distributed unit), a transmission reception point (transmission reception point, TRP), a transmission point (transmission point, TP), or any other radio access device. This is not specifically limited in this embodiment of this application.

An embodiment of this application further provides a signal processing method. The signal processing method is applied to the foregoing signal processing apparatus.

Figure 7:
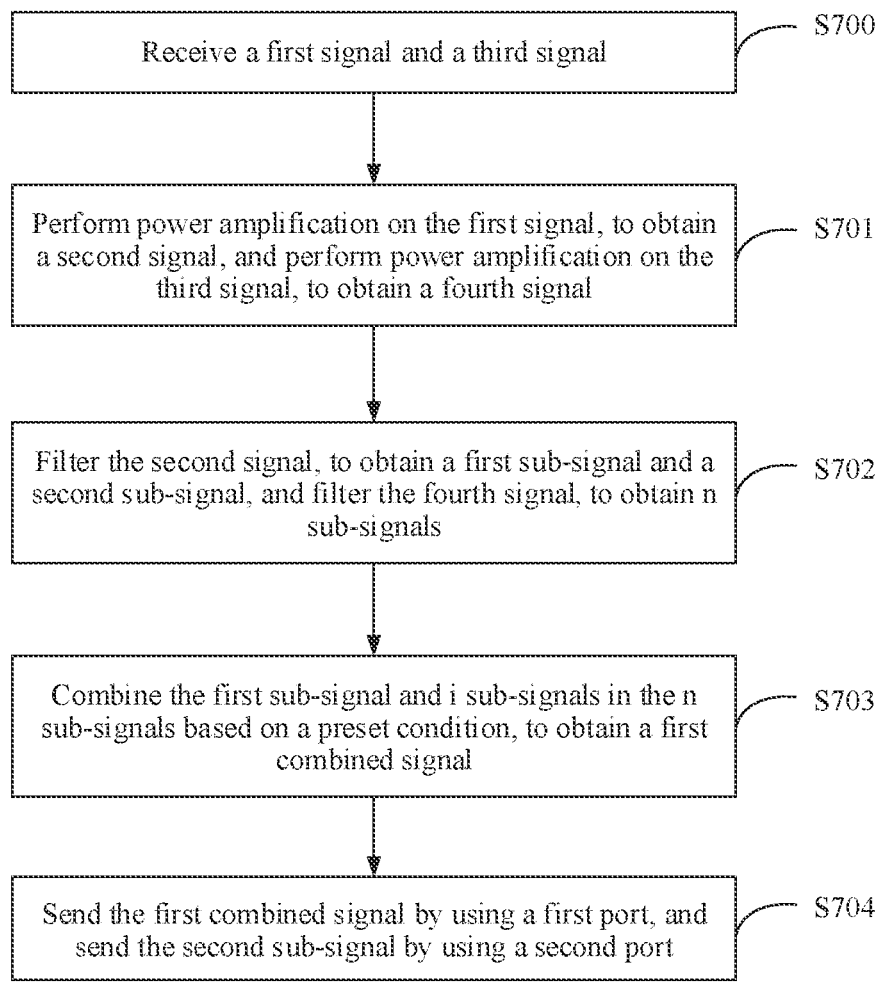
FIG. 7 is a schematic flowchart of a signal processing method according to an embodiment of this application.

FIG. 7 is a flowchart of a signal processing method according to an embodiment of this application. As shown in FIG. 7, the signal processing method may include the following steps.

S700: A signal processing apparatus receives a first signal and a third signal.

For definitions of the first signal and the third signal, refer to the foregoing description. Details are not described herein again.

S701: The signal processing apparatus performs power amplification on the first signal, to obtain a second signal, and performs power amplification on the third signal, to obtain a fourth signal.

Specifically, a first power amplifier performs power amplification on the first signal, to obtain the second signal, and a second power amplifier performs power amplification on the third signal, to obtain the fourth signal.

S702: The signal processing apparatus filters the second signal, to obtain a first sub-signal and a second sub-signal, and filters the fourth signal, to obtain n sub-signals.

Herein, n is an integer greater than or equal to 1, and the n sub-signals include at least a third sub-signal belonging to a third frequency band.

If n is an integer greater than or equal to 2, any two sub-signals in the n sub-signals belong to different frequency bands.

S703: The signal processing apparatus combines the first sub-signal and i ($1 \le i \le n$, and i is an integer) sub-signals in the n sub-signals based on a preset condition, to obtain a first combined signal.

The preset condition is to combine signals whose frequency band difference is greater than or equal to a preset threshold, or to combine a signal belonging to a first preset frequency band (for example, a frequency band 1) and a signal belonging to a second preset frequency band (for example, a frequency band 3).

S704: The signal processing apparatus sends the first combined signal by using a first port, and sends the second sub-signal by using a second port.

When i=n, refer to a process shown in FIG. 3 or FIG. 5.

Optionally, if $1 \le i < n$, the signal processing apparatus combines the second sub-signal and (n−i) sub-signals other than the i sub-signals in the n sub-signals based on the preset condition, to obtain a second combined signal, and sends the second combined signal by using the second port (refer to FIG. 4). Alternatively, the signal processing apparatus sends (n−i) sub-signals and the second sub-signal by using one port.

In conclusion, the signal processing apparatus in the embodiments of this application can not only effectively avoid a PIM problem but also reduce a quantity of ports used.

The foregoing descriptions of implementations allow a person skilled in the art to clearly understand that, for the purpose of convenient and brief description, division of the foregoing functional modules is taken as an example for illustration. In actual application, the foregoing functions can be allocated to different modules and implemented according to a requirement, that is, an inner structure of an apparatus is divided into different function modules to implement all or some of the functions described above. For a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located at one position, or may be distributed on a plurality of network units. Some or all of the units may be selected based on actual requirements to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The computer software product is stored in a storage medium and includes several instructions for instructing a computer device (which may be a personal computer, a server, or a network device) or a processor (English: processor) to perform all or a part of the steps of the methods described in the embodiments of the present invention. The foregoing storage medium includes: various media that can store program code, such as a USB flash drive, a removable hard disk, a read-only memory (English: Read-Only Memory, ROM for short), a random access memory (English: Random Access Memory, RAM for short), a magnetic disk, or a compact disc.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

The invention claimed is:

1. A signal processing apparatus, wherein the signal processing apparatus comprises a power amplification module, a processing module connected to the power amplification module, and a communication module connected to the processing module, and wherein:
the power amplification module comprises a first power amplifier and a second power amplifier; and
the processing module comprises a first filter connected to the first power amplifier, a second filter connected to the second power amplifier, and a combiner connected to the first filter, the second filter, and the communication module;
the first power amplifier is configured to:
perform power amplification on a received first signal to obtain a second signal; and
send the second signal to the first filter;
the first filter is configured to:
receive the second signal sent by the first power amplifier; and
filter the second signal to obtain a first sub-signal and a second sub-signal, wherein the first sub-signal belongs to a first frequency band, and the second sub-signal belongs to a second frequency band;
the second power amplifier is configured to:
perform power amplification on a received third signal to obtain a fourth signal; and
send the fourth signal to the second filter;
the second filter is configured to:
receive the fourth signal sent by the second power amplifier; and
filter the fourth signal to obtain n sub-signals, wherein the n sub-signals comprise at least a third sub-signal, the third sub-signal belongs to a third frequency band, and n is an integer greater than or equal to 1;
the combiner is configured to:
combine the first sub-signal and i sub-signals in the n sub-signals based on a preset condition to obtain a first combined signal; and
send the first combined signal and the second sub-signal to the communication module, wherein $1 \leq i \leq n$, and i is an integer; and
the communication module is configured to:
send the first combined signal by using a first port; and
send the second sub-signal by using a second port.

2. The signal processing apparatus according to claim 1, wherein if n is an integer greater than or equal to 2, any two sub-signals in the n sub-signals belong to different frequency bands.

3. The signal processing apparatus according to claim 2, wherein if $1 \leq i \leq n$,
the combiner is further configured to combine the second sub-signal and (n−i) sub-signals other than the i sub-signals in the n sub-signals based on the preset condition to obtain a second combined signal; and
wherein the combiner is configured to send the second sub-signal to the communication module comprises:
the combiner is configured to send the second combined signal to the communication module.

4. The signal processing apparatus according to claim 3, wherein the communication module is configured to send the second sub-signal by using a second port comprises:
the communication module is configured to send the second combined signal by using the second port.

5. The signal processing apparatus according to claim 1, wherein the preset condition is to combine signals whose frequency band difference is greater than or equal to a preset threshold, or to combine a signal belonging to a first preset frequency band and a signal belonging to a second preset frequency band.

6. An access network device, wherein the access network device comprises a signal processing apparatus, and wherein the signal processing apparatus comprises a power amplification module, a processing module connected to the power amplification module, and a communication module connected to the processing module, and wherein:

the power amplification module comprises a first power amplifier and a second power amplifier; and the processing module comprises a first filter connected to the first power amplifier, a second filter connected to the second power amplifier, and a combiner connected to the first filter, the second filter, and the communication module;

the first power amplifier is configured to:
perform power amplification on a received first signal to obtain a second signal; and
send the second signal to the first filter;

the first filter is configured to:
receive the second signal sent by the first power amplifier; and
filter the second signal to obtain a first sub-signal and a second sub-signal, wherein the first sub-signal belongs to a first frequency band, and the second sub-signal belongs to a second frequency band;

the second power amplifier is configured to:
perform power amplification on a received third signal to obtain a fourth signal; and
send the fourth signal to the second filter;

the second filter is configured to:
receive the fourth signal sent by the second power amplifier; and
filter the fourth signal to obtain n sub-signals, wherein the n sub-signals comprise at least a third sub-signal, the third sub-signal belongs to a third frequency band, and n is an integer greater than or equal to 1;

the combiner is configured to:
combine the first sub-signal and i sub-signals in the n sub-signals based on a preset condition to obtain a first combined signal; and
send the first combined signal and the second sub-signal to the communication module, wherein $1 \leq i \leq n$, and i is an integer; and the communication module is configured to:
send the first combined signal by using a first port; and
send the second sub-signal by using a second port.

7. A signal processing method, and the signal processing method comprises:

receiving a first signal and a third signal;
performing power amplification on the first signal to obtain a second signal;
performing power amplification on the third signal to obtain a fourth signal;
filtering the second signal to obtain a first sub-signal belonging to a first frequency band and a second sub-signal belonging to a second frequency band;
filtering the fourth signal to obtain n sub-signals, wherein the n sub-signals comprise at least a third sub-signal, the third sub-signal belongs to a third frequency band, and n is an integer greater than or equal to 1;
combining the first sub-signal and i sub-signals in the n sub-signals based on a preset condition to obtain a first combined signal, wherein $1 \leq i \leq n$, and i is an integer;
sending the first combined signal by using a first port; and
sending the second sub-signal by using a second port.

8. The signal processing method according to claim 7, wherein if n is an integer greater than or equal to 2, any two sub-signals in the n sub-signals belong to different frequency bands.

9. The signal processing method according to claim 8, wherein if $1 \leq i \leq n$, the signal processing method further comprises:
combining the second sub-signal and (n–i) sub-signals other than the i sub-signals in the n sub-signals based on the preset condition to obtain a second combined signal.

10. The signal processing method according to claim 9, wherein the sending the second sub-signal by using a second port comprises:
sending the second combined signal by using the second port.

11. The signal processing method according to claim 7, wherein:
the preset condition is to combine signals whose frequency band difference is greater than or equal to a preset threshold, or to combine a signal belonging to a first preset frequency band and a signal belonging to a second preset frequency band.

12. A non-transitory computer readable storage medium, wherein the non-transitory computer readable storage medium stores instructions to perform operations comprising:
receiving a first signal and a third signal;
performing power amplification on the first signal to obtain a second signal;
performing power amplification on the third signal to obtain a fourth signal;
filtering the second signal to obtain a first sub-signal belonging to a first frequency band and a second sub-signal belonging to a second frequency band;
filtering the fourth signal to obtain n sub-signals, wherein the n sub-signals comprise at least a third sub-signal, the third sub-signal belongs to a third frequency band, and n is an integer greater than or equal to 1;
combining the first sub-signal and i sub-signals in the n sub-signals based on a preset condition to obtain a first combined signal, wherein $1 \leq i \leq n$, and i is an integer;
sending the first combined signal by using a first port; and
sending the second sub-signal by using a second port.

13. The non-transitory computer readable storage medium according to claim 12, wherein if n is an integer greater than or equal to 2, any two sub-signals in the n sub-signals belong to different frequency bands.

14. The non-transitory computer readable storage medium according to claim 13, wherein if $1 \leq i \leq n$, the non-transitory computer readable storage medium stores instructions to perform the operations further comprising:
combining the second sub-signal and (n–i) sub-signals other than the i sub-signals in the n sub-signals based on the preset condition, to obtain a second combined signal.

15. The non-transitory computer readable storage medium according to claim 14, wherein the sending the second sub-signal by using a second port comprises:
sending the second combined signal by using the second port.

16. The non-transitory computer readable storage medium according to claim 12, wherein:
the preset condition is to combine signals whose frequency band difference is greater than or equal to a preset threshold, or to combine a signal belonging to a first preset frequency band and a signal belonging to a second preset frequency band.

\* \* \* \* \*

UNITED STATES PATENT AND TRADEMARK OFFICE
CERTIFICATE OF CORRECTION

PATENT NO. : 11,438,020 B2
APPLICATION NO. : 17/360287
DATED : September 6, 2022
INVENTOR(S) : Jia Lv, Haizheng Tang and Ling Guo It is certified that error appears in the above-identified patent and that said Letters Patent is hereby corrected as shown below:

In the Claims

In Column 12, In Line 51, In Claim 3, delete "$1 \leq i \leq n$" and insert -- $1 \leq i < n$ --.

In Column 14, In Line 7, In Claim 9, delete "$1 \leq i \leq n$" and insert -- $1 \leq i < n$ --.

In Column 14, In Line 51, In Claim 14, delete "$1 \leq i \leq n$" and insert -- $1 \leq i < n$ --.

Signed and Sealed this
Twenty-fifth Day of April, 2023

Katherine Kelly Vidal
*Director of the United States Patent and Trademark Office*